Figure 1:
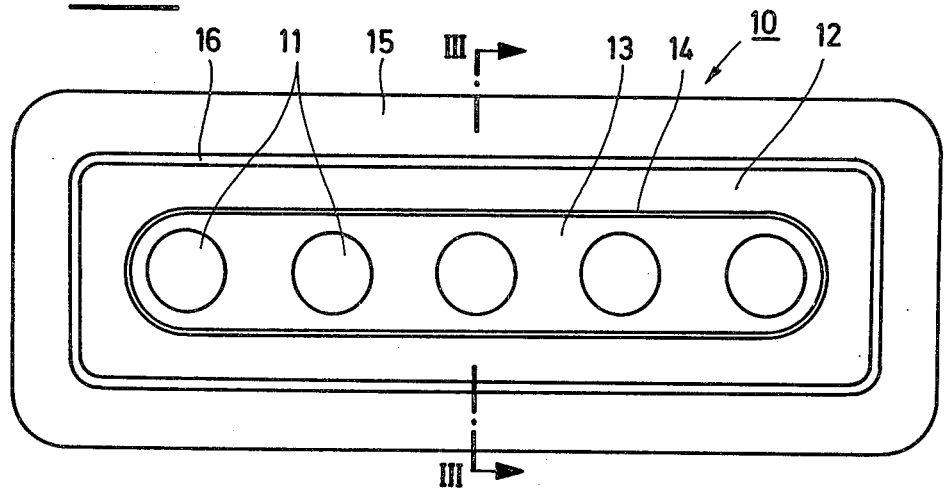

United States Patent

Aichert et al.

[11] 4,208,042
[45] Jun. 17, 1980

[54] EVAPORATING CRUCIBLE

[75] Inventors: Hans Aichert; Walter Dietrich, both of Hanau am Main; Alfred Hauff, Bruchköbel; Otto-Horst Hoffmann, Rodenbach; Herbert Stephan, Bruchköbel, all of Fed. Rep. of Germany

[73] Assignee: Leybold-Heraeus GmbH, Fed. Rep. of Germany

[21] Appl. No.: 963,059

[22] Filed: Nov. 22, 1978

[30] Foreign Application Priority Data

May 13, 1978 [DE] Fed. Rep. of Germany ....... 2821130

[51] Int. Cl.² ............................................. F27B 14/08
[52] U.S. Cl. .................................... 266/242; 266/275; 13/31 EB
[58] Field of Search .................. 266/242, 275, 287; 219/121 EB, 121 EM; 432/156; 13/31

[56] References Cited

U.S. PATENT DOCUMENTS

| 112,831 | 3/1871 | Millochau | 266/242 |
| 890,941 | 6/1908 | Treadwell | 266/275 |
| 2,152,446 | 3/1939 | Temple | 266/242 |
| 3,131,051 | 4/1964 | Hanks et al. | 13/31 |
| 3,132,198 | 5/1964 | Bois et al. | 13/31 |
| 3,607,222 | 9/1971 | Kennedy | 75/10 V |
| 3,730,962 | 5/1973 | Norwalk | 13/31 |
| 3,848,072 | 11/1974 | Dershiem et al. | 266/242 |
| 4,043,543 | 8/1977 | Courtenay et al. | 266/275 |
| 4,055,336 | 10/1977 | Massin | 266/275 |

Primary Examiner—R. Dean
Assistant Examiner—John P. Sheehan
Attorney, Agent, or Firm—Sprung, Felfe, Horn, Lynch & Kramer

[57] ABSTRACT

Evaporating crucible having a crucible floor and a peripheral rim therearound. The floor has a plurality of floor apertures for feeding a plurality of rods of evaporating material and, surrounding the floor apertures, superelevations are provided whereby the distance from the crucible floor to the maximum fill level of the evaporating material is reduced by at least fifteen percent.

7 Claims, 5 Drawing Figures

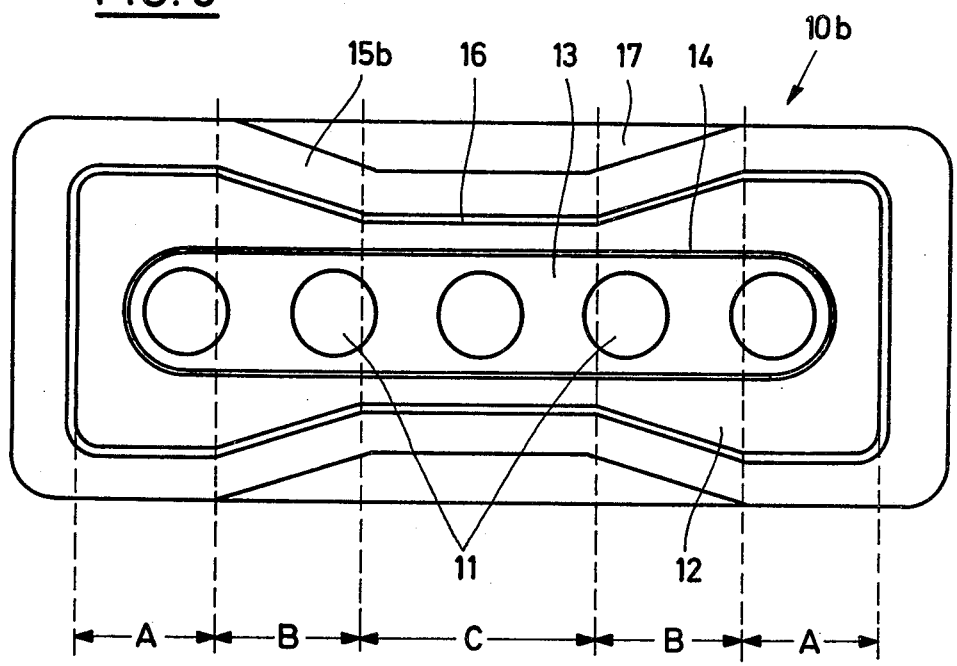

EVAPORATING CRUCIBLE

BACKGROUND

The invention relates to an evaporating crucible in which the material to be evaporated is fed in the form of rods through the crucible floor, and which has a rim set back from the circumference of the rods.

The bottom feeding of evaporating crucibles with material in rod form for evaporation is known through U.S. Pat. No. 3,607,222. The end surface of the rod is bombarded by an electron beam, so that a molten pool forms at the point of impingement of the electron beams, from which the evaporation takes place. The inside cross section of the known evaporating crucible, however, is substantially the same as the rod cross section. Such evaporating sources consequently have a point action, i.e., the cloud of vapor rising from the evaporation source has a limited horizontal cross section, so that is is not possible to dispose a plurality of substrates in the vapor stream much less produce thereon coatings of uniform thickness and of uniform composition throughout. A considerable irregularity persists even when a plurality of such evaporation sources are arrayed in what is termed an "evaporator field."

It is furthermore known to enlarge the cross section of the mouth of the crucible in the area of the molten pool at the upper end of the rod to a multiple of the rod cross section. In this case the molten pool extends horizontally beyond the circumference of the rods fed through the bottom. In this case, too, a multiple array of such evaporation sources cannot produce a vapor stream that is in any way uniform or in which a plurality of substrates can be disposed on which uniform coatings are to be produced. It must be considered that, as the diameter of the aperture of the crucible increases, the horizontal spacing of the plurality of crucibles would have to increase, thereby worsening the degree of irregularity.

There is another problem in water-cooled evaporating crucibles, in which a molten pool or bath is used, in that a solidified metal layer forms on the inside surface of the evaporating crucible, which is called a "dish" or also a "skull." This solidified metal layer has the undesirable effect that it prevents interaction between the material being evaporated and the evaporation crucible. When the material is fed in rod form through the bottom, however, the solidified layer produces the additional problem that it occasionally sticks to the rods, so that the dish-shaped solidified material is lifted together with the infed rods. A cavity is thus formed under the dish, into which a part of the molten metal flows as soon as the dish is locally melted through on account of the alteration of the heat balance through the removal of the dish from the cooling action provided at the walls of the crucible. At unforeseeable intervals, therefore, a considerable portion of the material being evaporated fails to participate in the evaporating action, resulting in irregularities in the coating process, since the rate of condensation is necessarily dependent on the rate of evaporation.

THE INVENTION

The invention is therefore directed to the problem of improving an evaporating crucible of the kind described in the beginning, such that the surface of the bath will have a large, uninterrupted area, and furthermore such that the dish or skull forming in the crucible will be prevented from being lifted from the crucible bottom by the rods being fed through it.

The solution of the problem is accomplished in the initially described evaporating crucible in accordance with the invention by providing the crucible bottom with a plurality of apertures for the feeding of a plurality of rods, and by providing superelevations in the immediate surrounding of the bottom apertures, whereby the depth of the evaporation material is reduced in that area by at least 15%.

The invention consists first of all in the structural combining of a plurality of individual, bottom-fed crucibles into a single evaporating crucible of large area. This measure alone, however, has proven difficult to put into practice on account of the above-described lifting of the solidified evaporation material. By the incorporation of the above-mentioned superelevations in the crucible floor, however, a reduction or weakening of the thickness is brought about in the solidified material, so that it has virtually no strength, enabling the rods to be pushed through the solidified metal lying on the rest of the crucible floor. At the same time the solidified metal remains permanently on the crucible floor, so that the undesirable, abrupt bursting of the molten metal through a "skull" cannot occur. The fill depth of an evaporating crucible is a determining factor in the design of the crucible and is specified for the particular crucible. By means of the superelevations, which reduce the depth of the evaporating material above them by at least 15%, the temperature gradient at the superelevations is reduced, i.e., the melt is kept at a higher temperature level directly over the superelevations, and this prevents the formation of solidified metal in the same thickness in this area.

The invention can be represented in two different embodiments. In the one case the superelevations can be continuous for all bottom openings, the top surface of the superelevations encompassing the bottom apertures in the manner of a rectangle. It is also possible, however, and advantageous as well, to dispose or construct the superelevations such that each bottom aperture will be surrounded by with an annular superelevation.

An especially advantageous design of an evaporating crucible which permits rapid adaptation to special vacuum depositing conditions is characterized, in accordance with the further invention, in that the rim of the crucible is separate from the crucible floor and is releasably fastened to the crucible floor. The rim in this case can be advantageously constructed such that the distance between opposite rim portions varies over the length of the evaporating crucible and in the middle of the crucible it is smaller than at the ends thereof.

The effect of this is as follows: It is known that if heat is applied uniformly to an elongated evaporating crucible, the rate of evaporation is greatest in the center of the crucible. By concentrating the heating power at the ends of the crucible, compensation can be provided for this effect to a certain degree. This compensation, however, is limited by the fact that it is often undesirable to deliver too much energy to tne ends of the crucibles, because, in the case of the evaporation of alloys for example, the low-boiling components would be vaporized preferentially, so that a uniform coating thickness would be achieved, but one of varying composition. Consequently, an additional compensation of the local evaporation rate can be brought about by the above-described constriction in the profile of the rim of the crucible, without producing such a great irregularity of the energy distribution.

Examples of the embodiment of the invention and the manner in which they operate will be explained in particular with the aid of FIGS. 1 to 5.

Figure 2:
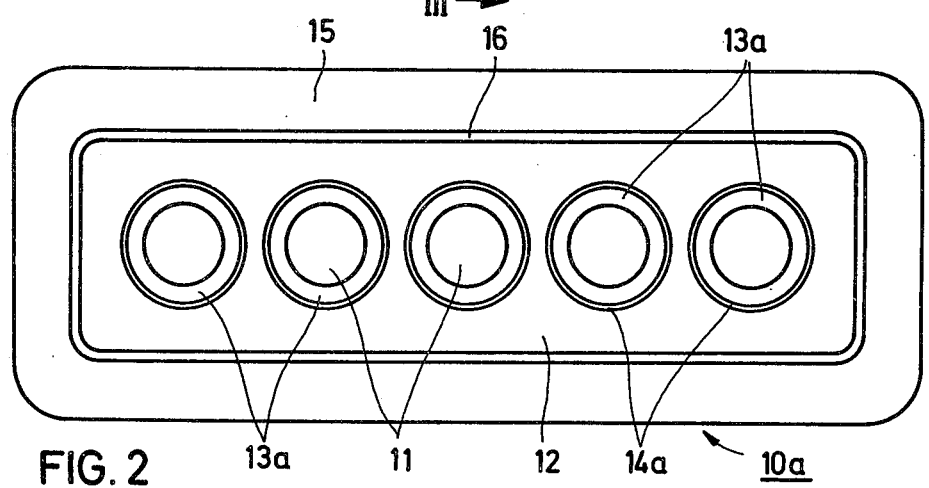
Figure 3:
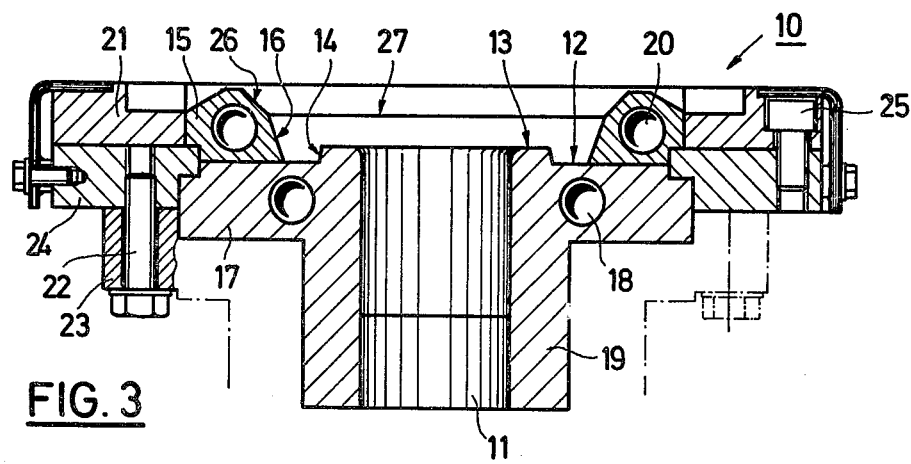
Figure 4:
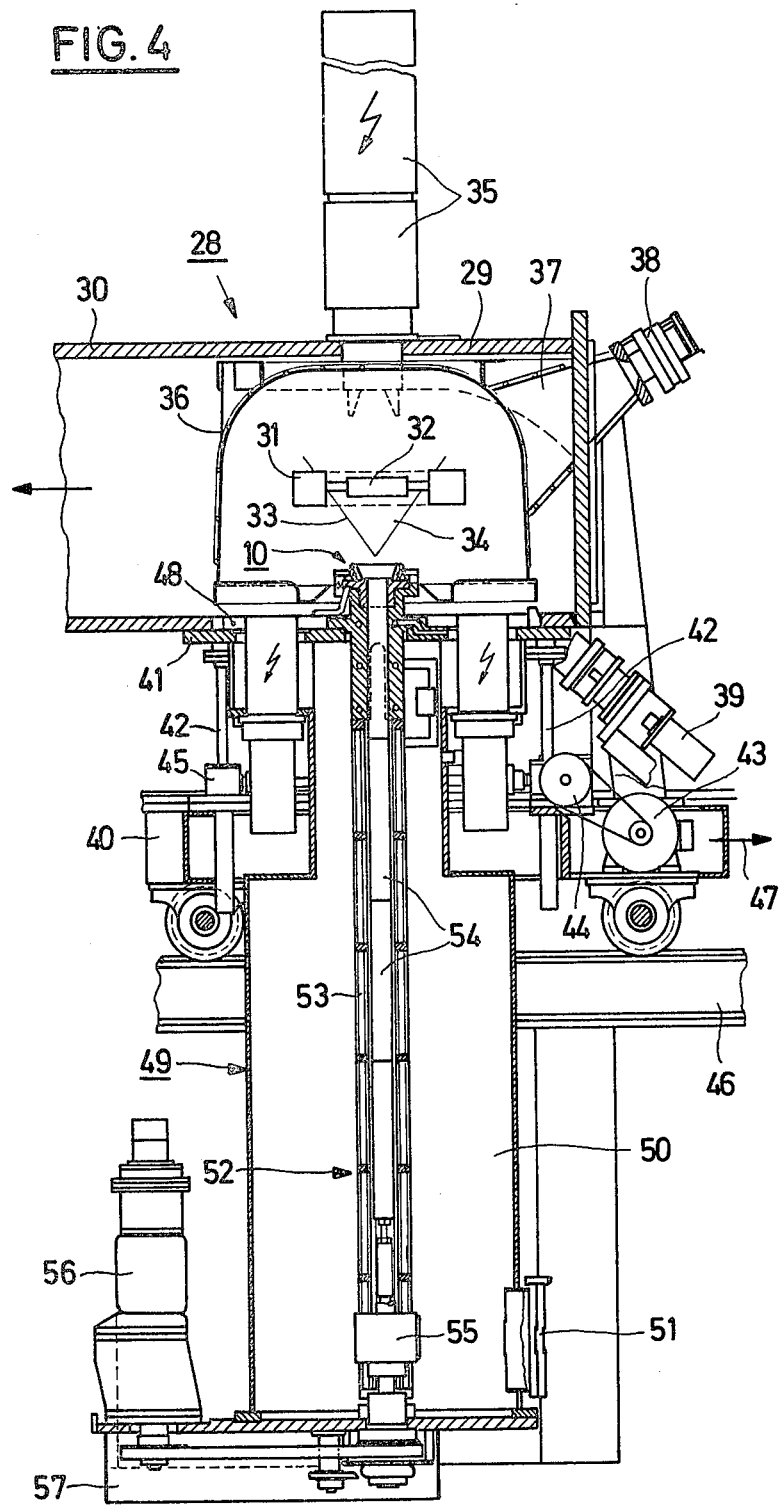

FIG. 1 is a top plan view of a substantially rectangular evaporating crucible for the feeding of five rods in a row, all of the bottom orifices being encompassed by a continuous superelevation, FIG. 2 is an evaporating crucible in accordance with Claim 1, except that the superelevation is of divided design in that each bottom orifice is surrounded by an annular superelevation, FIG. 3 represents a vertical cross section taken through the crucible of FIG. 1 along line III—III, on an enlarged scale, FIG. 4 is a vertical cross section taken through a complete vapor deposition apparatus into which there is placed an evaporating crucible in accordance with FIGS. 1 and 2, and FIG. 5 is a variant of the evaporating crucible of FIG. 1 having a rim in which the distance between opposite rim portions varies over the length of the evaporating crucible and is shorter in the middle of the crucible than at the ends thereof.

The evaporating crucible 10 in FIG. 1 has a substantially rectangular plan and is provided along its longest plane of symmetry with five bottom apertures 11 which are in the form of cylindrical bores and whose axes are situated in the plane of symmetry of the evaporating crucible. These bottom apertures 11 are disposed in the floor of the crucible 12 and are encompassed by a continuous superelevation 13 which is is in the form of a plateau, so to speak, above the crucible bottom. The height of the superelevation above the floor of the crucible amounts to about 5 to 6 mm, which has to be considered in connection with a maximum fill depth above the crucible floor 12 of about 17 to 20 mm. This superelevation 13 has, in the plan view, the shape of a rectangle with rounded ends. The top surface passes through a bevel 14 to the crucible floor 12.

The crucible floor 12 is surrounded on all sides by a rim 15 which is provided also with a bevel 16 on its inner side facing the superelevation 13. As soon as rod-shaped evaporation material is fed through the floor apertures 11 and is melted at the top, a molten pool spreads out within the rim 15; this can be brought about by means of an electron beam, for example. The surface of the pool extends also over the superelevation 13, the depth of the bath at this point being, however, shallower than it is above the rest of the crucible floor 12.

FIG. 2 shows a modified evaporating crucible 10a in which the only difference is that the superelevation 13 which is continuous in FIG. 1 is of a divided construction in that each floor aperture 11 is surrounded by an annular superelevation 13a which passes through a conical chamfer 14a to the bottom 12 of the crucible. The height of the superelevations 13a is the same as the height of superelevation 13 in FIG. 1.

Details with regard to the construction of the evaporating crucible 10 of FIG. 1, which will also apply to the evaporating crucible 10a of FIG. 2, will be further explained with the aid of FIG. 3. The crucible floor 12 and the superelevation 13 are formed by the upper surfaces of a floor plate 17 which is provided with cooling passages 18. The floor aperture 11 is surrounded by a hollow cylinder 19 which provides for the guidance and sealing of the rods fed through the floor aperture 11. The rim 15 is likewise provided with a cooling passage 20 and is welded into a marginal flange 21 which surrounds rim 15 on all sides. A marginal flange 24 is clamped against the floor plate 17 by means of a plurality of bolts 22 passing through a base plate 23. The marginal flange 21 is likewise clamped against this marginal flange 24 by means of a plurality of bolts 25 distributed about its periphery. The marginal flange 21, and with it the rim 15, is replaceable by removing the bolts 25.

The rim 15 has on its inner side the previously described bevel 16 facing the bevel 14 of the superelevation 13. The bevel 16 encloses with the crucible floor 12 an angle of 60 to 80 degrees. At the top it is adjoined by an additional bevel 26 whose angle with respect to the crucible floor 12 is lower and amounts to between 30 to 60 degrees, for example. The arris 27 formed between the bevels 16 and 26 simultaneously defines the depth of the molten alloy in crucible 10 during the vapor depositing process. The bevel angle, especially bevel 26, effectively prevents metal from condensing there during the vapor depositing process and forming a thick bead thereon. It is evident that the superelevation 13 considerably reduces the distance between the crucible floor 12 and the arris 27, resulting in the effect described above.

The use of the evaporating crucible 10 in a vacuum depositing apparatus 28 will be described with the aid of FIG. 4. This apparatus consists of a vacuum chamber 29 which leads through a laterally attached pump connection 30 to a pump unit which is not shown. Above the evaporating crucible 10 there is a substrate rack 31 bearing a plurality of substrates 32 disposed one behind the other, of which, however, only the front substrate is visible. The vapor stream rising from the evaporating crucible 10 is symbolized by the lines 33 and 34. The evaporating crucible 10 and the substrates 32 are heated by an electron gun 35, so that the evaporation and condensation of alloy coatings can be achieved with sufficient strength of adhesion. Within the vacuum chamber 29 there is mounted a radiation shield 36 surrounding on all sides the substrate and the evaporating crucible, with the exception, however, of openings which are necessary for loading and for bombardment with electron beams. An observation tube 37 provided with a viewing device 37 is attached laterally. A meter means 39 for the control of the vapor deposition is disposed laterally beneath the floor of the vacuum chamber 29.

The evaporating crucible 10 is fastened on a carriage 40 by means of a mounting plate 41 borne on carriage 40 by means of four raising spindles 42 of which only the two front ones are visible. By means of a motor 43, a belt drive 44 and spindle nuts 45 it is possible to lower the evaporating crucible 10 out of the vacuum chamber 29 far enough so that it can roll out together with carriage 40 on rails 46 in the direction of the arrow 47 laterally beneath the vacuum chamber 29. Within the vacuum chamber 29 there is an aperture 48 which is closed hermetically by the mounting plate 41 during operation.

Underneath the mounting plate 41 there is a feeding system 49 which consists of an evacuable pot 50 containing a loading opening 51 and a rod advancing means 52. The latter in turn consists of a rod guiding means 53 which is connected coaxially to the bottom of the floor apertures 11 and to the hollow cylinder 19 (FIG. 3). A plurality of rods 54 made of the alloy to be deposited are stacked in the rod guiding means 53. They are fed into the evaporating crucible 10 by a motor-driven feeder 55 at the same rate at which they are melted in the crucible. The feeder 55 is driven by a motor 56 and a belt drive 57.

In FIG. 5 there is represented an evaporating crucible 10b whose rim 15b does not describe a rectangle but in which the distance between opposite rim portions varies over the length of the evaporating crucible and is shorter in the middle of the crucible than it is at the ends thereof. In this manner the evaporating crucible 10 is divided into five zones A-B-C-B-A longitudinally, of which zones A at the ends of the crucible have considerably greater width than the zone C in the center of the crucible. The shape of the rim 15b in zones B is such that the individual rim portions join one another smoothly. By the reduction of the width of the crucible 10b in the middle zone C, the rate of evaporation of the entire bath surface, and hence the amount of heat required for the evaporating process, is reduced at this point. This contributes considerably towards making the coating thickness and the composition of the coating uniform over the entire length of the evaporating crucible 10b.

What is claimed is:

1. Evaporating crucible comprising a crucible floor and a peripheral rim therearound defining the maximum fill level, said crucible floor having a plurality of floor apertures for the feeding of a plurality of rods of evaporating material and, surrounding each of the floor apertures, at least one superelevated area disposed on a portion of the crucible floor, which reduces the distance at the mouth of each aperture to the maximum fill level of the evaporating material by at least fifteen percent with respect to the distance from the remaining crucible floor to the maximum fill level.

2. Evaporating crucible of claim 1 wherein the superelevated area is one continuous area for all floor apertures and the top surface encompasses the floor apertures in the manner of an oval.

3. Evaporating crucible of claim 1 wherein each floor aperture is surrounded by a circular superelevation.

4. Evaporating crucible of claim 1 wherein the rim has a substantially rectangular shape and the floor apertures are positioned in a row.

5. Evaporating crucible of claim 1 wherein the rim is separate from the crucible floor and is releasably fastened thereto.

6. Evaporating crucible of claim 4 wherein the distance between opposite rim portions differs over the length of the evaporating crucible and is shorter in the crucible center than at the crucible ends.

7. Evaporating crucible of claim 5 wherein the rim has a hollow cooling passage.

* * * * *